United States Patent
Benslimand et al.

(10) Patent No.: US 7,400,080 B2
(45) Date of Patent: Jul. 15, 2008

(54) ELASTOMER ACTUATOR AND A METHOD OF MAKING AN ACTUATOR

(75) Inventors: Mohamed Yahia Benslimand, Nordborg (DK); Peter Gravesen, Nordborg (DK)

(73) Assignee: Danfoss A/S, Nordborg (DK)

( * ) Notice: Subject to any disclaimer, the term of this patent is extended or adjusted under 35 U.S.C. 154(b) by 33 days.

(21) Appl. No.: 10/528,503

(22) PCT Filed: Sep. 18, 2003

(86) PCT No.: PCT/DK03/00603

§ 371 (c)(1),
(2), (4) Date: Mar. 27, 2005

(87) PCT Pub. No.: WO2004/027970

PCT Pub. Date: Apr. 1, 2004

(65) Prior Publication Data

US 2006/0066183 A1    Mar. 30, 2006

(30) Foreign Application Priority Data

Sep. 20, 2002    (DK)    ................ 2002 01380

(51) Int. Cl.
*H01L 41/08* (2006.01)
(52) U.S. Cl. ...................... 310/369; 310/328
(58) Field of Classification Search ................ 310/311, 310/328, 366, 369
See application file for complete search history.

(56) References Cited

U.S. PATENT DOCUMENTS

| | | | | |
|---|---|---|---|---|
| 3,565,195 A | 2/1971 | Miller et al. | ................ | 177/210 |
| 3,753,294 A | 8/1973 | Attali et al. | ................ | 33/133 |
| 3,875,481 A | 4/1975 | Miller et al. | ................ | 317/246 |
| 4,266,263 A | 5/1981 | Haberl et al. | ................ | 361/283 |
| 4,330,730 A * | 5/1982 | Kurz et al. | ................ | 310/331 |
| 4,370,697 A | 1/1983 | Haberl et al. | ................ | 361/283 |
| 4,376,302 A * | 3/1983 | Miller | ................ | 367/157 |
| 4,384,394 A * | 5/1983 | Lemonon et al. | ................ | 29/25.35 |

(Continued)

FOREIGN PATENT DOCUMENTS

DE    30 06 620 A1    9/1981

(Continued)

OTHER PUBLICATIONS

Publication "High-field electrostriction of elastomeric polymer dielectrics for actuation" by Roy Kornbluh, et al., SRI International; SPIE vol. 3669, pp. 149-161; Mar. 1999.

(Continued)

*Primary Examiner*—Thomas M Dougherty
(74) *Attorney, Agent, or Firm*—McCormick, Paulding & Huber LLP

(57) ABSTRACT

A tubular elastomer actuator with a shape in a cross-sectional view which shape exposes at most one single axis of symmetry of a specific length, e.g. an oval shape. The actuator could be made from a sheet made from a plurality of plate shaped elements which are laminated together and rolled. Each plate shaped element may have a corrugation that gives the element an anisotropic structure, and contains an electrode on only one surface. The actuator displacement is the result of shrinkage displacement of the plate shaped elements upon the application of electrical field across their thickness.

16 Claims, 4 Drawing Sheets

U.S. PATENT DOCUMENTS

| | | | |
|---|---|---|---|
| 4,386,386 A | 5/1983 | Akita | 361/283 |
| 4,431,882 A | 2/1984 | Frame | 200/5 |
| 4,494,409 A | 1/1985 | Kondo et al. | 73/651 |
| 4,634,917 A | 1/1987 | Dvorsky et al. | 310/328 |
| 4,654,546 A | 3/1987 | Kirjavainen | 307/400 |
| 4,731,694 A | 3/1988 | Grabner et al. | 361/280 |
| 4,825,116 A * | 4/1989 | Itoh et al. | 310/335 |
| 4,829,812 A * | 5/1989 | Parks et al. | 73/12.04 |
| 4,836,033 A | 6/1989 | Seitz | 73/862.04 |
| 4,852,443 A | 8/1989 | Duncan et al. | 84/1.04 |
| 4,866,412 A | 9/1989 | Rzepczynski | 338/114 |
| 4,879,698 A * | 11/1989 | Langberg | 367/140 |
| 4,986,136 A | 1/1991 | Brunner et al. | 73/862.04 |
| 5,060,527 A | 10/1991 | Burgess | 73/862.68 |
| 5,090,246 A | 2/1992 | Colla et al. | 73/718 |
| 5,090,248 A | 2/1992 | Cimmino et al. | 73/780 |
| 5,115,680 A | 5/1992 | Lew | 73/763 |
| 5,173,162 A | 12/1992 | Hagimura et al. | 204/299 |
| 5,255,972 A | 10/1993 | Shirasu | 60/528 |
| 5,321,332 A * | 6/1994 | Toda | 310/322 |
| 5,410,210 A * | 4/1995 | Sato et al. | 310/363 |
| 5,425,275 A | 6/1995 | Lockshaw | 73/775 |
| 5,447,076 A | 9/1995 | Ziegler | 73/862.626 |
| 5,449,002 A | 9/1995 | Goldman | 128/779 |
| 5,528,452 A | 6/1996 | Ko | 361/283.4 |
| 5,548,564 A | 8/1996 | Smith | 367/140 |
| 5,642,015 A | 6/1997 | Whitehead et al. | |
| 5,755,090 A | 5/1998 | Hu | 60/39.091 |
| 5,755,909 A | 5/1998 | Gailus | 156/229 |
| 5,841,143 A | 11/1998 | Tuma et al. | 250/458.1 |
| 5,977,685 A | 11/1999 | Kurita et al. | 310/311 |
| RE37,065 E | 2/2001 | Grahn | |
| 6,210,514 B1 | 4/2001 | Cheung et al. | 156/241 |
| 6,282,956 B1 | 9/2001 | Okada | 73/504.12 |
| 6,343,129 B1 | 1/2002 | Pelrine et al. | 381/191 |
| 6,376,971 B1 | 4/2002 | Pelrine et al. | 310/363 |
| 6,437,489 B1 * | 8/2002 | Shinke et al. | 310/369 |
| 6,543,110 B1 | 4/2003 | Pelrine et al. | 29/25.35 |
| 6,545,384 B1 | 4/2003 | Pelrine et al. | 310/309 |
| 6,545,395 B2 * | 4/2003 | Matsui et al. | 310/369 |
| 6,581,481 B1 | 6/2003 | Perusek | 73/862.337 |
| 6,583,533 B2 | 6/2003 | Pelrine et al. | 310/309 |
| 6,586,859 B2 | 7/2003 | Kornbluh et al. | 310/309 |
| 6,628,040 B2 | 9/2003 | Pelrine et al. | 310/307 |
| 6,662,658 B2 | 12/2003 | Foote | 73/514.29 |
| 6,664,718 B2 | 12/2003 | Pelrine et al. | 310/800 |
| 6,707,236 B2 | 3/2004 | Pelrine et al. | 310/800 |
| 6,768,246 B2 | 7/2004 | Pelrine et al. | 310/339 |
| 6,781,284 B1 | 8/2004 | Pelrine et al. | 310/330 |
| 6,806,621 B2 | 10/2004 | Heim et al. | 310/328 |
| 6,809,462 B2 | 10/2004 | Pelrine et al. | 310/800 |
| 6,812,624 B1 | 11/2004 | Pei et al. | 310/800 |
| 6,876,135 B2 | 4/2005 | Pelrine et al. | 310/339 |
| 6,882,086 B2 | 4/2005 | Kornbluh et al. | 310/328 |
| 6,891,317 B2 | 5/2005 | Pei et al. | 310/800 |
| 6,911,764 B2 | 6/2005 | Pelrine et al. | 310/328 |
| 6,940,211 B2 | 9/2005 | Pelrine et al. | 310/330 |
| 7,034,432 B1 | 4/2006 | Pelrine et al. | 310/309 |
| 7,049,732 B2 | 5/2006 | Pei et al. | 310/800 |
| 7,064,472 B2 | 6/2006 | Pelrine et al. | 310/324 |
| 7,104,146 B2 | 9/2006 | Benslimane | 73/862.626 |
| 2001/0026165 A1 | 10/2001 | Pelrine et al. | 324/750 |
| 2001/0035723 A1 | 11/2001 | Pelrine et al. | 318/116 |
| 2002/0008445 A1 | 1/2002 | Pelrine et al. | 310/330 |
| 2002/0050768 A1 | 5/2002 | Beck et al. | 310/334 |
| 2002/0130673 A1 | 9/2002 | Pelrine et al. | 324/727 |
| 2002/0175594 A1 | 11/2002 | Kornbluh et al. | 310/317 |
| 2002/0175598 A1 | 11/2002 | Heim et al. | 310/328 |
| 2002/0185937 A1 | 12/2002 | Heim et al. | 310/339 |
| 2003/0006669 A1 * | 1/2003 | Pei et al. | 310/309 |
| 2003/0066741 A1 | 4/2003 | Burgess et al. | 200/61.43 |
| 2003/0067245 A1 * | 4/2003 | Pelrine et al. | 310/311 |
| 2003/0125781 A1 * | 7/2003 | Dohno et al. | 607/75 |
| 2003/0141473 A1 | 7/2003 | Pelrine et al. | 251/129.06 |
| 2003/0141787 A1 | 7/2003 | Pelrine et al. | 310/365 |
| 2003/0213960 A1 | 11/2003 | Kitagawa et al. | |
| 2003/0214199 A1 | 11/2003 | Heim et al. | 310/309 |
| 2004/0008853 A1 | 1/2004 | Pelrine et al. | 381/191 |
| 2004/0012301 A1 | 1/2004 | Benslimane et al. | 310/311 |
| 2004/0124738 A1 | 7/2004 | Pelrine et al. | 310/307 |
| 2004/0217671 A1 * | 11/2004 | Rosenthal et al. | 310/328 |
| 2004/0232807 A1 | 11/2004 | Pelrine et al. | 310/800 |
| 2004/0263028 A1 | 12/2004 | Pei et al. | 310/800 |
| 2005/0040736 A1 * | 2/2005 | Topliss et al. | 310/367 |
| 2005/0104145 A1 | 5/2005 | Benslimane et al. | 257/415 |
| 2005/0157893 A1 | 7/2005 | Pelrine et al. | 381/190 |
| 2006/0113878 A1 | 6/2006 | Pei et al. | 310/363 |
| 2006/0113880 A1 | 6/2006 | Pei et al. | 310/800 |
| 2006/0119225 A1 | 6/2006 | Heim et al. | 310/339 |
| 2006/0158065 A1 | 7/2006 | Pelrine et al. | 310/328 |
| 2007/0269585 A1 | 11/2007 | Benslimane et al. | |
| 2007/0277356 A1 | 12/2007 | Benslimane et al. | |

FOREIGN PATENT DOCUMENTS

| | | | |
|---|---|---|---|
| DE | 30 23 218 A1 | 2/1982 | |
| DE | 38 41 243 A1 | 6/1990 | |
| DE | 198 26 391 A1 | 12/1999 | |
| DE | 200 04 248 U1 | 8/2000 | |
| DE | 100 54 247 A1 | 5/2002 | |
| EP | 0 387 180 A1 | 9/1990 | |
| EP | 0 855 307 B1 | 3/2003 | |
| EP | 1481738 A2 * | 12/2004 | |
| FR | 2 309 833 | 12/1976 | |
| FR | 2 793 937 A1 | 11/2000 | |
| JP | 55-42474 * | 3/1980 | 310/800 |
| JP | 55-91299 * | 7/1980 | 381/186 |
| JP | 1-273372 | 11/1989 | |
| JP | 2002-237625 * | 8/2003 | |
| KR | 90-1465 | 3/1990 | |
| WO | WO 96/34701 | 11/1996 | |
| WO | WO 97/27822 | 8/1997 | |
| WO | WO 00/66970 | 11/2000 | |
| WO | WO 01/06575 A1 | 1/2001 | |
| WO | WO 01/06579 A2 | 1/2001 | |
| WO | WO 01/58973 A2 | 8/2001 | |
| WO | WO 01/59852 A3 | 8/2001 | |
| WO | WO 01/63738 A2 | 8/2001 | |
| WO | WO 01/65615 A3 | 9/2001 | |
| WO | WO 02/37660 A1 | 5/2002 | |
| WO | WO 2004/079832 A2 | 9/2004 | |
| WO | WO 2005/079187 A2 | 9/2005 | |
| WO | WO 2005/081676 A2 | 9/2005 | |

OTHER PUBLICATIONS

Publication Micro-Electro-Mechanical Systems (MEMS)—2000-; by R. Trujillo, et al.; Presented at 2000 ASIME International Mechanical Engineering Congress and Exposition, Nov. 5-10, 2000; Orland, FL; pp. 709-716.

International Search Report for PCT Serial No. PCT/DK03/00603 dated Feb. 5, 2004.

PCT Search Report for Serial No. PCT/DK03/00848 dated Mar. 25, 2004.

Article entitled "Electrostrictive Polymer Artificial Muscle Actuators" by R. Kornbluh, et al. Proceedings, 1998 IEEE International Conference on Robotics and Automation (Cat. No. 98CH36146), IEEE International Conference on Robotics and Automation, Leuven, Belgium, May 16-20, 1998; pp. 2147-2154, vol. 3, XP002269205, 1998.

Article entitled "Spontaneous formation of ordered structures in thin films of metals supported on an elastomeric polymer" by N. Bowden, et al., Nature, vol. 393 dated May 14, 1998; pp. 146-149.

Article "Silicone Elastomers with Controlled Surface Composition Using Argon or Hydrogen Plasma Treatment" by B. Olander, et al., Journal of Applied Polymer Science, vol. 90, 2003 Wiley Periodicals, Inc.; pp. 1378-1383.

* cited by examiner

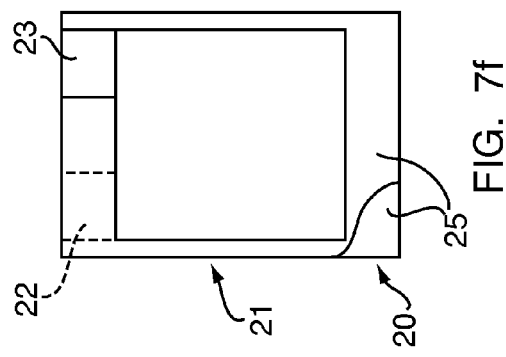
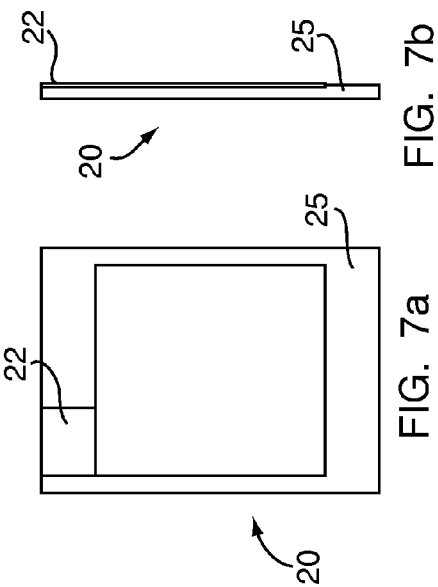
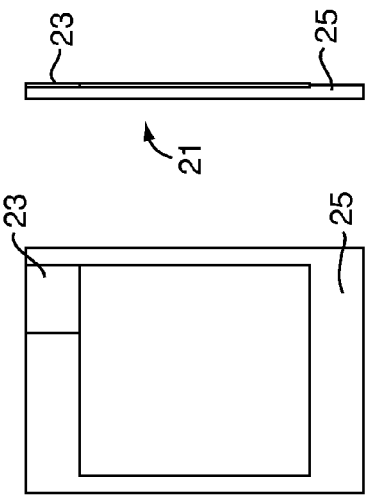

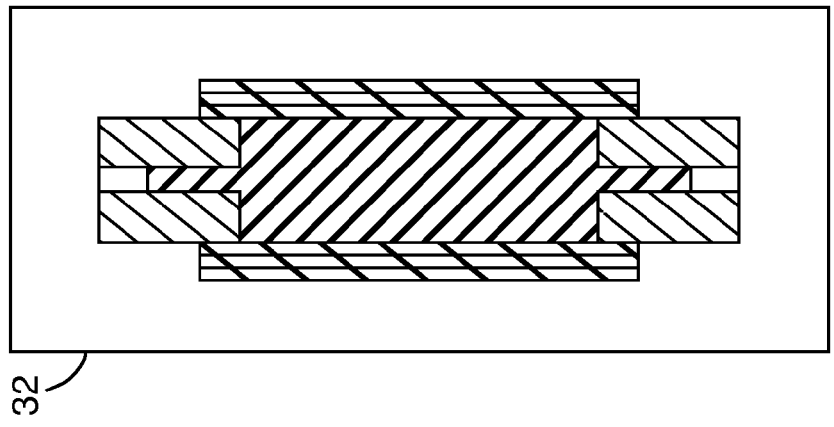
FIG. 8d Cure Inside Oven
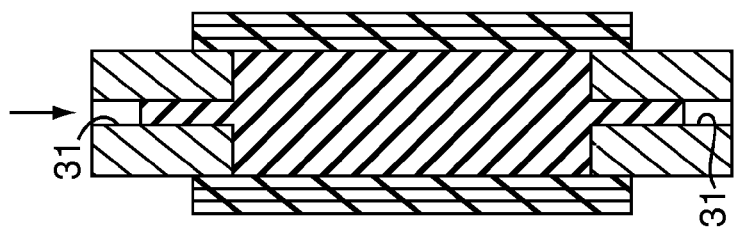
FIG. 8c Fill in with Elastomer Solution
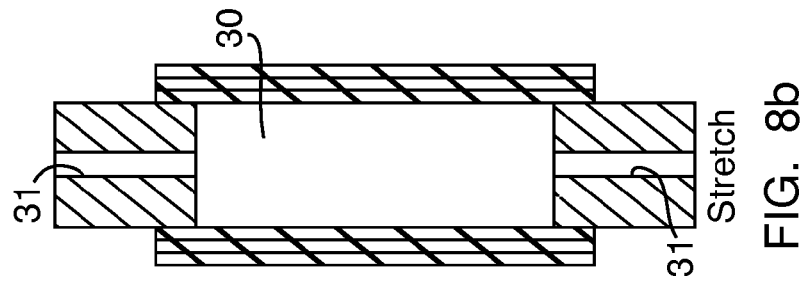
FIG. 8b Stretch
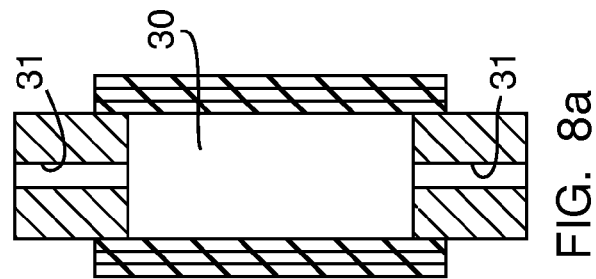
FIG. 8a

ELASTOMER ACTUATOR AND A METHOD OF MAKING AN ACTUATOR

CROSS REFERENCE TO RELATED APPLICATIONS

This application is entitled to the benefit of and incorporates by reference essential subject matter disclosed in international Patent Application No. PCT/DK2003/000603 filed on Sep. 18, 2003 and Danish Patent Application No. PA 2002 01380 filed on Sep. 20, 2002.

FIELD OF THE INVENTION

The present invention relates to an actuator, e.g. for use in robotic applications.

BACKGROUND OF THE INVENTION

Elastomer actuators with electrodes for deflecting an elastomeric material are known to facilitate large deformation in a relatively low electric field, e.g. when compared with alternative dielectric materials, e.g. piezoelectric materials including ceramics. The principle of operation is that an electrical potential between two electrodes generates an electrical field leading to a force of attraction or repulsion. As a result, the distance between the electrodes changes which leads to compression or tension of the elastomeric material which is thereby deformed. Due to the similarity between the principle of operation and the functioning of a muscle, an elastomer actuator is sometimes referred to as an Electrostrictive Polymer Artificial Muscle (EPAM).

Typically, elastomer actuators are made by applying a conductive electrode, e.g. a carbon containing paint or a thin layer of gold to both sides of a film made from an elastomeric material e.g. Silicone or Polyurethane. The film is typically made in a moulding process. Laminated actuators are known, e.g. from U.S. Pat. No. 5,977,685, disclosing layers of a polyurethane elastomer with electrodes on each side, laminated together to form a deformable sheet. Each layer has slit gaps formed in a horizontal direction, whereby the layer maintains the volume during a shrinkage displacement.

E.g. in order to save space, elastomer sheets can be rolled up to form cylindrical actuators to replace more traditional linear actuators in multiple small-scale systems, e.g. in robotic applications forming legs or grippers of a robotic wrist etc. In the heretofore seen rolled actuators, the film is rolled into a tubular portion fitted with mechanical connectors at axially opposite ends. Upon application of an electrical field to the electrodes, the sheet contracts or expands axially during deformation of the elastomeric material. It has, however, been found, that the rolled configuration of the elastomer film to a certain extent limits the ability of the film to deform and thus reduces the performance. In particular when the cylindrical actuator is designed for longitudinal expansion and contraction, it is necessary that the longitudinal change in length is compensated by a radial constriction of the cylindrical actuator, and since a cylindrical shape of a body implies stiffness towards radial constriction, the cylindrical shape limits the extent of longitudinal expansion and contraction. Until now, a maximum stroke in the order of 5-7 percent of the length of the rolled cylindrical actuator is typically accepted as the limit of the technology.

SUMMARY OF THE INVENTION

In accordance with the present invention, provision is made for an actuator made from an elastomer film and which facilitates an improved performance. Accordingly, the present invention in a first aspect provides an actuator comprising a tubular portion extending in a longitudinal direction, the tubular portion comprising a body of an elastomeric material arranged between two electrodes, wherein any line of symmetry extending between two opposite points on a periphery in a cross-section perpendicular to the longitudinal direction has a length which is different from any other such line of symmetry.

In other words there may be provided an actuator with a cross-section having no lines of symmetry, one single line of symmetry or a plurality of lines of symmetry all being of different lengths.

As an example, the shape may be non-circular or non-quadrangular. As an example, the actuator may, in that cross-sectional view, expose two axis of symmetry having different length. As an example, the actuator may, in the above mentioned cross-sectional view, have an oval shape, it may have the shape of an egg or it may be rectangular.

When an electrical potential is applied over the electrodes, the electrical force of attraction or repulsion forces the electrodes toward or away from each other whereby the elastomeric material is deformed. Due to the specific shape, it is achieved that the proportions of the tubular portion in directions perpendicular to the longitudinal direction are free to change during longitudinal expansion and contraction and therefore, the ability of the actuator to expand and constrict in the direction perpendicular to the longitudinal direction is improved when compared with actuators e.g. having a circular or a quadrangular cross-sectional shape, i.e. actuators exposing multiple axes of symmetry having equal length. Accordingly, a larger longitudinal expansion and contraction can be achieved.

Preferably, and in order to facilitate an easy manufacturing, the tubular portion may be formed by rolling up a sheet comprising at least two elements each comprising a body of an elastomeric material and an electrode attached to a first surface thereof, wherein deformation of the body and/or the electrode is restricted in a first direction and supported in a another, second, direction. The second direction may preferably be parallel to the longitudinal direction. Due to the restriction and supporting of deformation, respectively, it is achieved that the body deforms only, or at least primarily, in one direction, i.e. the deformation occurs in the longitudinal direction while the restriction of deformation is circumferentially around the tubular portion, leading to a conservation of the perimeter of the tubular portion.

The body may be a dielectric body and as will be described in further details, it may preferably have a plurality of corrugation on at least one surface and it may preferably have anisotropic properties. The two elements are stacked so that a surface of one of the elements is in contact with a surface of another element.

The restriction and supporting of the deformation in the two directions may be achieved e.g. by forming corrugations in the electrodes and in the elastomeric bodies. The corrugations could extend mutually parallel in the first direction and thus support deformation in the second direction being perpendicular to the first direction. The corrugations could be formed during manufacturing of the elastomeric body in a moulding process. By vaporising a conductive material, e.g. gold, silver, copper, aluminium, or any similar conductive metal onto the body in a subsequent process, a very thin electrode may be formed onto the corrugations of the body. The electrode will effectively prevent deformation in the direction of the corrugations.

Preferably, supply paths in the form of conductive terminals are connected to each of the at least two elements to apply different electrical potentials to the corresponding electrodes. In order to make connection of a power source easier, the sheet may comprise:

- an element of a first type comprising a conductive terminal of a first type being in electrical contact with the electrode of the element
- an element of a second type comprising a conductive terminal of a second type being in electrical contact with the electrode of the element, wherein the conductive terminal of the first type is electrically isolated from the conductive terminal of the second type when the elements are stacked to form a sheet of alternating elements of the first and second type. As an example, the terminals may be exposed on the surface of the elastomer bodies on alternating different locations, e.g. so that every second element has a terminal at a rightmost end of the element and every other second element has a terminal at a leftmost end of the element, when the elements are stacked to form a sheet. In the sheet, the elastomer material of the bodies forms isolation between the terminals of adjacent elements.

Preferably the rolled structure consists of alternately one element of the first type and one element of the second type. The element of the first type is connected to a first supply path and the element of the second type is connected to a second supply path. Hereby is achieved that a single working layer in the laminated structure consists of one electrode on one first element, one body of one second element and one electrode on one second element. Another layer in the laminated structure consists of one electrode on one second element, one body of one first element and one electrode on one first element.

The element of the first type may further comprise a conductive terminal of a second type being electrically isolated from the electrode of the element. Correspondingly, the element of the second type may comprise a conductive terminal of a first type being electrically isolated from the electrode of the element. When the conductive terminals of the first type are in mutual electrical contact and the conductive terminals of the second type are in mutual electrical contact, e.g. when the elements are stacked, all terminals of the first type may be connected to one terminal of a power source at one connection point and all terminals of the second type may be connected to another terminal of the power source at another connection point. The terminals which are electrically isolated from the electrode of the element serve to bridge the electrical potential difference across the element between two adjacent elements.

In order further to facilitate application of the power source, the conductive terminals of the first and/or the second type may cover peripheral rim portions of the bodies of the elastomeric material, e.g. so that the terminals of the first type cover the rim portion at one location and the terminals of the second type cover the rim portion at another location, when the elements are stacked to form a sheet of alternating elements of the first and second type. Conductive wires attached to the terminals along the rim portions may thus connect the electrodes with a power source.

In a specific embodiment of the invention, the rolled structure is formed by rolling the elements around an elastomer core. In order to reduce the impact of the core on the compliance of the rolled actuator, the elastomer core may be softer than the elastomer of the bodies of the actuator.

In a specific drum shaped embodiment of the invention the rolled structure exposes a cavity limited by the tubular portion, i.e. limited by the rolled structure, and two closure parts fastened at axially opposite ends of the tubular portion. The closure parts may have the shape of axle journals, e.g. comprising fastening means for attaching the actuator to an application, e.g. a robotic handgrip. Hereby is achieved that the rolled structure exposes a cylindrical cross-section where the core of the structure is a passive cavity. The core of an elastomer material could be made by filling the cavity with an elastomer material, e.g. in a liquid state. Subsequently, the liquid core is hardened, e.g. while the rolled structure is stretched axially. Hereby is achieved that the body of the structure exposes compressive stress while the core is filled and hardened. When the structure afterwards is released axially, the compressive stress of the body will induce tensile stress in the core, and the force balance will result in a stable self-supporting structure, when the actuator is in a released inactivated position.

In a second aspect, the present invention relates to a method of making a rolled elastomer actuator, said method comprising the steps of:

forming a sheet from layers of elements, each comprising a body of an elastomer material and an electrode in contact with a surface of the body, rolling up the sheet to form a hollow tubular portion with a shape wherein any line of symmetry extending between two opposite points on a periphery in a cross-section perpendicular to the longitudinal direction has a length which is different from any other such line of symmetry, e.g. into an oval or rectangular shape.

The method according to the second aspect may be extended to cover steps for making an actuator according to any of the features of the first aspect of the invention, and in particular, the tubular portion may be filled with a liquid elastomer material which is subsequently hardened to form an elastomer core for the tubular portion.

BRIEF DESCRIPTION OF THE DRAWINGS

In the following, a preferred embodiment of the invention will be described in further details with reference to the drawing in which:

FIGS. 7a-7f show an assembling sequence for the assembling of two elements into one sheet,
and
FIGS. 8a-8d show filling of a cavity of the rolled structure with a liquid elastomer.

DETAILED DESCRIPTION OF THE PREFERRED EMBODIMENTS

Figure 1:
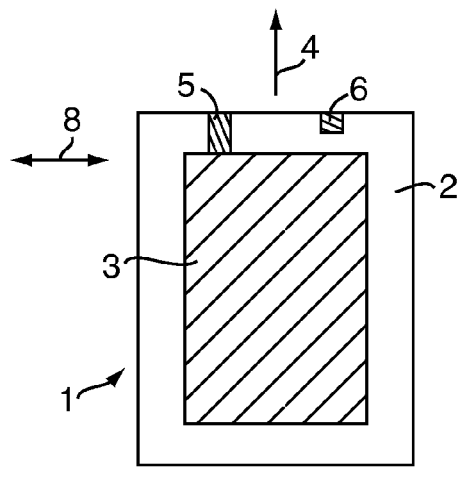
FIG. 1 shows a first plate shaped element of the actuator.

FIG. 1 shows a plate shaped element 1 for a laminated stack forming a sheet for an actuator. The element 1 comprises a body 2 of an elastomeric material. The body 2 has a corrugated surface having a corrugated profile on one of its two surfaces, and an electrode 3 deposited on a large part of the corrugated surface. The electrode is deposited onto the surface of the body in a thickness of a few hundreds of Angstroms e.g. by vapour deposition of conductive particles onto the surface. The electrode could be made from gold, silver, or copper or from any other conductive material.

The corrugations of the body 2 are not shown in FIG. 1 but they should be understood to be corrugations, e.g. with a quasi-sinusoidal or a curved cross-sectional shape e.g. with a corrugation height from the top of a corrugation to the bottom of the corrugation in the order of ⅓-⅕ of the total thickness of the elastomer body. As an example, the corrugation height of a body having a total thickness of 20 µm could be in the size of 5 µm. With respect to the orientation of the body 2 and electrode 3 of FIG. 1, the corrugations extend in a horizontal direction, i.e. in the direction indicated by the arrow, cf. numeral 8. The body 2 including the corrugations is made e.g. in a moulding process from a silicone or rubber material or from any other elastomer.

When the electrode is deposited onto the corrugated surface of the body 2, e.g. by vaporisation, the electrode will form a thin metal layer with corrugations corresponding to the corrugations of the body. As a result, the element, and thus a sheet made from a plurality of elements becomes more flexible in a direction perpendicular to the corrugations, i.e. in a vertical direction indicated by arrows 4 in FIG. 1 than in directions non-perpendicular to the corrugations, e.g. in the horizontal direction in FIG. 1. This structure gives the element and thus a sheet made from elements anisotropic properties. Due to the anisotropic properties and the fact that the volume of the element is conserved during deformation, it is achieved that a compression or expansion of the thickness of the element will be transformed mainly into deformation in the direction perpendicular to the corrugations, i.e. in the vertical direction of FIG. 1.

Two conductive terminals 5 and 6 are shown on top of the electrode 3. One terminal 5 constitutes an electrical path to the electrode 3. The other terminal 6 is made from an electrically conductive material but it is, however, not connected to the electrode 3. By facilitating connection of an electrical source, the terminals 5, 6 serve for connection of a power source to establish an electrical potential difference between electrodes of adjacent elements, when the elements are stacked to form a laminated structure.

Figure 2:
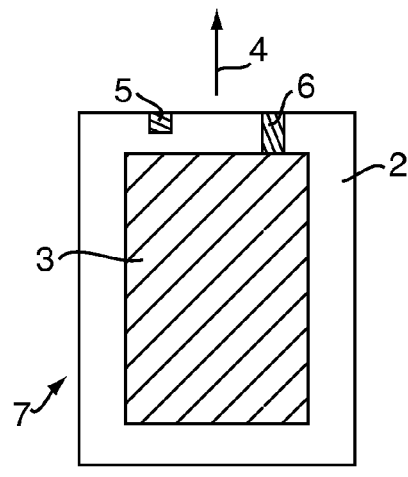
FIG. 2 shows a second plate shaped element of the actuator.

FIG. 2 shows a plate shaped element 7 similar to that of FIG. 1, but wherein the supply path 6 constitutes a conductive terminal connected to the electrode 3, and wherein the supply path 5 is not connected to the electrode 3. This gives two different plate shaped elements. In the following, the element with numeral 1 is to be referred to as a plate shaped element of a first type and the element with numeral 7 is referred to as a plate shaped element of a second type.

Figure 3:
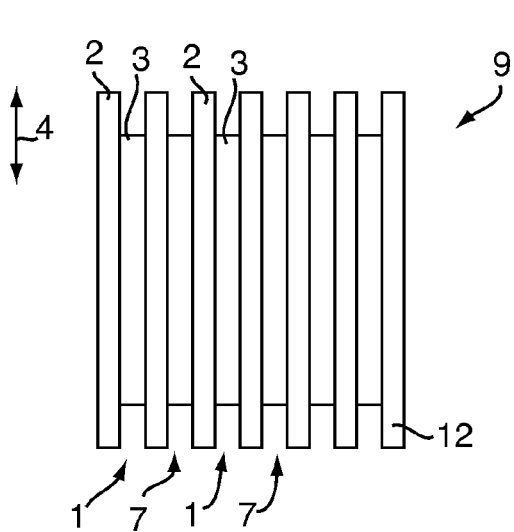
FIG. 3 shows a laminated actuator.

FIG. 3 shows a side view of an actuator 9 in the form of a structure laminated from elements comprising bodies made from an elastomeric material 2 and an electrode 3. In order to visualise the structure more clearly, the thicknesses of the bodies and the electrodes are shown without considering right proportions. In reality, the electrodes may be vaporised on the elastomeric body 2, whereby the total thickness of a single elements 1, 7 is limited to around 15-30 mm, of which the electrode has a thickness of a few hundreds of Angstroms. Accordingly, the laminated actuator 9 forms a flat sheet structure. In the laminated structure of the actuator 9, elements of the first type 1 are arranged adjacent and alternating elements of the second type 7, thereby forming two conductive connection paths extending along the peripheral rim portion of the actuator for connecting an electrical source for establishing an electrical potential difference between electrodes of adjacent elements in the actuator.

Figure 4:
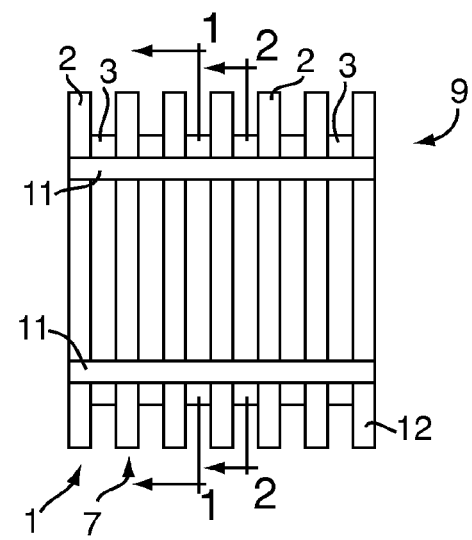
FIG. 4 shows the laminated actuator in a top view.

The cross section 1-1 of FIG. 4 indicates the view shown in FIG. 1, and the cross section 2-2 indicates the view shown in FIG. 2. The two terminals 5 and 6 are connected to an electrical high voltage source via conductive wires 11 attached to the terminals along the rim portions of the terminals. This connection gives the electrode of elements 1 and 7 different potentials, and the induced electrical field will pull the electrodes towards each other. This will result in a shrinkage displacement of each of the bodies 2, indicated by arrows 10 on FIG. 4, whereby the vertical displacement of the actuator will occur, indicated by arrows 4 in FIGS. 1, 2 and 3.

The force developed by the actuator increases with the number of elements in the laminated structure. A sealing sheet 12, comprising a body of the same elastomer as the first and second element, is closing the laminated structure, whereby the electrode of the last element is sealed and electrically insulated from the surroundings. The sealing sheet 12 is arranged in contact with an electrode of the adjacent element.

Figure 5:
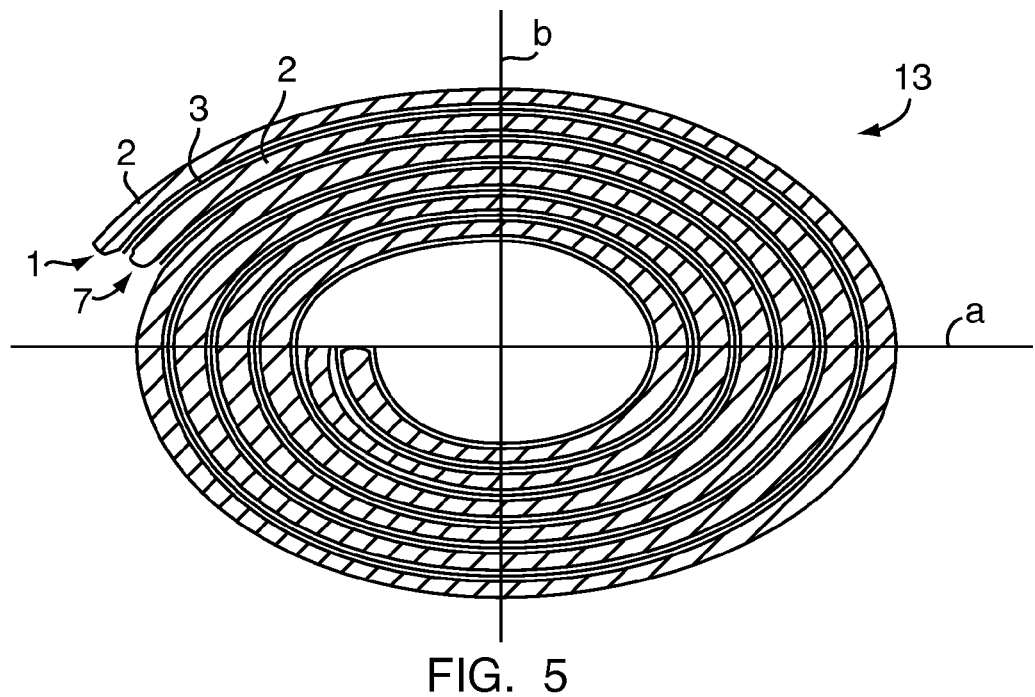
FIG. 5 is a cross-sectional view in radial direction of a rolled actuator.

The actuator 9 in FIGS. 3 and 4 is plate shaped and the degree of force which the actuator can exert depends on the number of elements included in the laminated sheet and on the cross-sectional area of each element. FIG. 5 shows a structure for an actuator 13, wherein the two plate-shaped elements 1, 7 are laminated together to form a sheet which is subsequently rolled. In this structure where only two elements are laminated and rolled, the degree of force depends mainly on the number of windings. In FIG. 5 the actuator 13 comprises 3 windings of a sheet made from an element of a first type and an element of a second type. Due to the rolling, the actuator forms a cylindrical shape.

Due to the corrugation of the elements including the electrodes, the actuator becomes very compliant to deflect in one direction, and less compliant in other directions. By rolling the elements into a roll having a longitudinal axis perpendicular to the corrugations, the actuator becomes compliant to extend and shorten in the longitudinal direction, whereas it is stiff in the direction of the corrugations. Due to volume conservation of the elastomeric polymeric bodies in the elements forming the sheet, radial constriction and swelling of the actuator is necessary during longitudinal extending and shortening. Since changes to the cross-sectional area is impossible without changing the perimeter of a circular rolled actuator, a circular cross-sectional shape will exert more resistance towards the radial constriction. However, in an oval, e.g. an elliptic or rectangular cross-sectional shape as shown in FIG. 5, different ratios between the extent in the "a" and "b" directions will expose different areas for the same perimeter and thus facilitate radial constriction and thus longitudinal extending and shortening of the rolled actuator.

In further details, the following applies for a rolled sheet with a circular cross sectional shape:

$$\text{Perimeter} = 2 \times \pi \times r$$

$$\text{Area} = \pi \times r^2$$

$$\text{Volume} = \text{Area} \times \text{length}$$

wherein r denotes the radial dimension of the roll. Since the length is changed, and the Volume is fixed, the area has to be changed. The area can only change as a result of changes to the radius which, in theory, is not possible and, in practise, very difficult due to the perimeter conservation. On the contrary, the following applies for a rolled sheet with an elliptical, i.e. a non-circular cross sectional shape:

$$\text{Perimeter} = 2 \times \pi \times \sqrt{\frac{a^2 + b^2}{2}}$$

Area=π×a×b

Volume=Area×length wherein a and b represent the half the lengths of the two axes of symmetry in the ellipse. Accordingly, it is easier to extend and shorten the rolled actuator having an elliptical cross-sectional shape since it is possible to find different value sets of a and b where each set results in a constant perimeter value while the area changes.

Multiple geometries of non-circular cross-sectional shapes facilitate changes to the area without changing the perimeter of which one is shown in FIG. 5.

Figure 6:
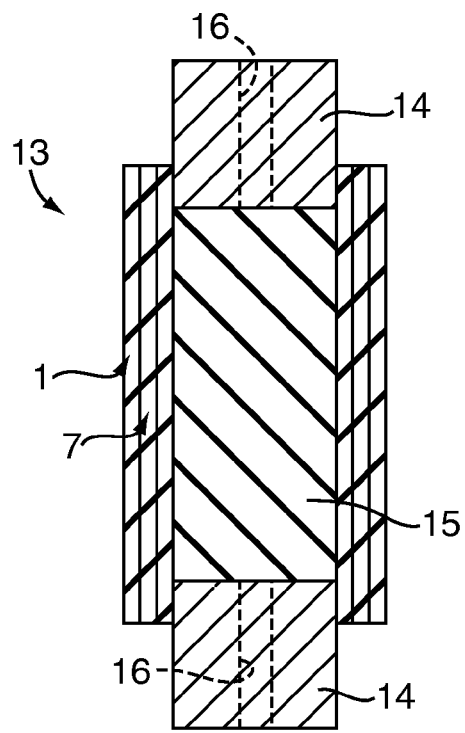
FIG. 6 shows a cross-sectional view in longitudinal direction of a rolled actuator.

FIG. 6 shows a cross-sectional view of the actuator 13 parallel to the longitudinal direction. A cavity 15 is confined between the rolled structure 1, 7 and the two closure parts in the shape of axle journals 14. The axle journals have an outer cross sectional shape which corresponds to the inner cross sectional shape of the tubular portion.

The sheet made from the plate shaped elements 1 and 7 is rather soft. The actuator structure is therefore also rather soft, and, depending upon the specific material and thicknesses of the elements 1, 7 the actuator will be unable to support itself when it is not mounted in an application or fixture. In order to stabilise the actuator, and make handling easier, the cavity 15 is filled with a soft elastomer material, e.g. through at least one of the holes 16. This filling of the cavity 15 occurs while the actuator is stretched axially, e.g. by means of a fixture. When the elastomer material inside the cavity 15 is hardened, it exposes a deformable elastomer body, of a softer nature than the elastomer bodies of the elements 1 and 7. When the axially stretched actuator is released, the two axle journals will be pulled together, which will deform the material inside the cavity 15. Compressive and tensile stress balance in this mechanical structure will result in a self-supported rolled actuator.

FIGS. 7a-7f show an element of a first type 20 and an element of a second type 21. The element of the first type comprises a conductive terminal 22 of a first type and a conductive terminal 23 of a second type. The elements are stacked to form a sheet 24 comprising alternating elements of the first type 20 and elements of the second type 21, i.e. in which the conductive terminals are placed at opposite sides of the elastomeric body 25.

FIGS. 8a-8d show the process of filling the cavity 30 with a liquid elastomer material. In FIG. 8a, the actuator is ready for the elastomer core to be filled into the cavity through the openings 31 formed in the axle journals. In FIG. 8b, the actuator is stretched axially prior to the filling. In FIG. 8c, the liquid elastomer core is filled into the cavity and in FIG. 8d, the core is cured, e.g. inside an oven symbolised by the line 32.

While the present invention has been illustrated and described with respect to a particular embodiment thereof, it should be appreciated by those of ordinary skill in the art that various modifications to this invention may be made without departing from the spirit and scope of the present invention.

What is claimed is:

1. An actuator comprising:
    a tubular portion extending in a longitudinal direction, the tubular portion comprising a body of an elastomeric material arranged between two electrodes,
    wherein any line of symmetry extending between two opposite points on a periphery in a cross-section perpendicular to the longitudinal direction has a length which is different from any other such line of symmetry,
    wherein the tubular portion is formed by rolling up a sheet comprising at least two elements each comprising a body of an elastomeric material and an electrode attached to a first surface thereof,
    wherein deformation of the body is restricted in a first direction and supported in a another, second, direction,
    wherein the sheet comprises includes:
    an element of a first type comprising a conductive terminal of a first type being in electrical contact with the electrode of the element
    an element of a second type comprising a conductive terminal of a second type being in electrical contact with the electrode of the element, and
    wherein the conductive terminal of the first type is electrically isolated from the conductive terminal of the second type when the elements are stacked.

2. The actuator according to claim 1, wherein the second direction is parallel to the longitudinal direction.

3. The actuator according to claim 1, wherein the first direction is substantially perpendicular to the second direction.

4. The actuator according to claim 1, wherein the body and the electrode comprise corrugations extending in the first direction.

5. The actuator according to claim 1, wherein the:
    element of the first type further comprises a conductive terminal of a second type being electrically isolated from the electrode of the element, and wherein
    the element of the second type further comprises a conductive terminal of a first type being electrically isolated from the electrode of the element,
    wherein the conductive terminals of the first type are in mutual electrical contact and the conductive terminals of the second type are in mutual electrical contact when the elements are stacked.

6. The actuator according to claim 1, wherein the conductive terminals of the first type cover a first peripheral rim portion of the body of an elastomeric material, and the conductive terminals of the second type cover a second peripheral rim portion of the body of an elastomeric material.

7. The actuator according to claim 1, wherein elements of the first type are arranged alternately elements of the second type.

8. An actuator comprising:
    a tubular portion extending in a longitudinal direction, the tubular portion comprising a body of an elastomeric material arranged between two electrodes,
    wherein any line of symmetry extending between two opposite points on a periphery in a cross-section perpendicular to the longitudinal direction has a length which is different from any other such line of symmetry,
    wherein the tubular portion is formed by rolling up a sheet comprising at least two elements each comprising a body of an elastomeric material and an electrode attached to a first surface thereof,
    wherein deformation of the body is restricted in a first direction and supported in a another, second, direction, and wherein the tubular portion is formed by rolling of the sheet around a core of an elastomeric material.

9. An actuator comprising:

a tubular portion extending in a longitudinal direction, the tubular portion comprising a body of an elastomeric material arranged between two electrodes, wherein any line of symmetry extending between two opposite points on a periphery in a cross-section perpendicular to the longitudinal direction has a length which is different from any other such line of symmetry, wherein the tubular portion is filled with a core of an elastomeric material.

10. The actuator according to claim 9, wherein the core is softer than the elastomeric material forming the tubular portion.

11. The actuator according to claim 9, wherein the core is made by filling a cavity limited by the tubular portion and two closure parts with a liquid elastomer material which is subsequently hardened while the tubular portion is stretched axially.

12. An actuator comprising:

an elastomeric material arranged between two electrodes forming a tubular portion extending in a longitudinal direction and having a cross-section, wherein the cross-section of the tubular portion is asymmetrical;

wherein the tubular portion is formed by multiple layers of elastomeric material and electrode; and wherein the tubular portion comprises elements of a first type and elements of a second type.

13. The actuator according to claim 12 wherein:

the element of the first type comprises a conductive terminal of a first type; and the element of the second type comprises a conductive terminal of a second type, wherein the conductive terminal of the first type is offset from the conductive terminal of the second type when the elements are stacked.

14. The actuator according to claim 12 wherein the elastomeric material has at least one corrugated surface.

15. The actuator according to claim 14 wherein the corrugated surface is molded.

16. The actuator according to claim 15 wherein at least one electrode is deposited on the corrugated surface of the elastomeric material and forms electrode corrugations corresponding to the corrugations of the corrugated surface of the elastomeric material.

\* \* \* \* \*